United States Patent [19]

LeMoine

[11] Patent Number: 4,650,974
[45] Date of Patent: Mar. 17, 1987

[54] CONDENSATION SHIELD

[75] Inventor: George J. LeMoine, Monroe, Conn.

[73] Assignee: Pitney Bowes Inc., Stamford, Conn.

[21] Appl. No.: 763,151

[22] Filed: Aug. 7, 1985

[51] Int. Cl.⁴ .................... G07B 17/00; H01H 9/04
[52] U.S. Cl. ................................ 235/101; 235/1 D;
     235/145 R; 200/302.1
[58] Field of Search ............... 235/101, 145 R, 1 D;
     200/304, 305, 302.1, 302.2; 361/220, 399, 424;
     335/202; 179/179; 174/52 PE

[56] References Cited

U.S. PATENT DOCUMENTS

| | | | |
|---|---|---|---|
| 3,682,378 | 8/1972 | Rouan et al. | 235/101 |
| 3,845,243 | 10/1974 | Schmersal et al. | 358/240 |
| 3,845,253 | 10/1974 | Hanneman et al. | 179/179 |
| 3,909,504 | 9/1975 | Browne | 174/52 PE |
| 3,978,457 | 8/1976 | Check, Jr. et al. | 364/200 |
| 4,301,507 | 11/1981 | Soderberg et al. | 364/464 |
| 4,308,953 | 1/1982 | Cohen | 206/334 |
| 4,322,702 | 3/1982 | Bosch | 335/202 |
| 4,336,529 | 6/1982 | Buan | 235/101 X |
| 4,386,388 | 5/1983 | Beun | 361/399 |
| 4,388,671 | 6/1983 | Hall et al. | 361/383 |
| 4,394,707 | 7/1983 | Consoli | 361/398 |
| 4,396,830 | 8/1983 | Isozaki et al. | 235/145 R |
| 4,399,487 | 8/1983 | Neumann | 361/391 |

OTHER PUBLICATIONS

Electronics Packaging and Production Jun. 1984, pp. 150–151 by James Dierke.

Primary Examiner—Benjamin R. Fuller
Attorney, Agent, or Firm—David E. Pitchenik; Melvin J. Scolnick; Charles G. Parks, Jr.

[57] ABSTRACT

The invention disclosed is a postage meter containing a conductive barrier shield specifically designed to permit maximum protection for the component circuit board against static electricity, moisture and other contaminants.

17 Claims, 3 Drawing Figures

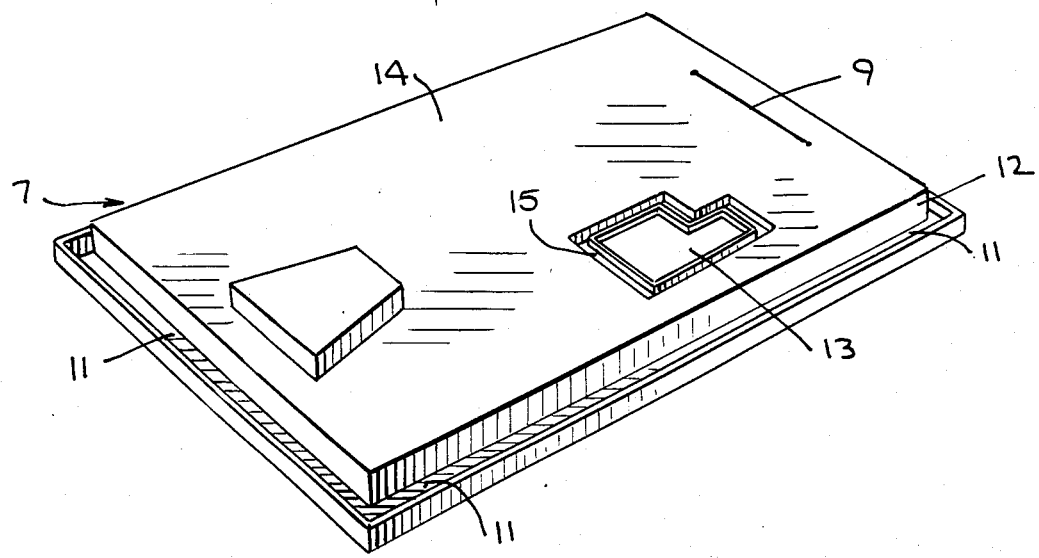
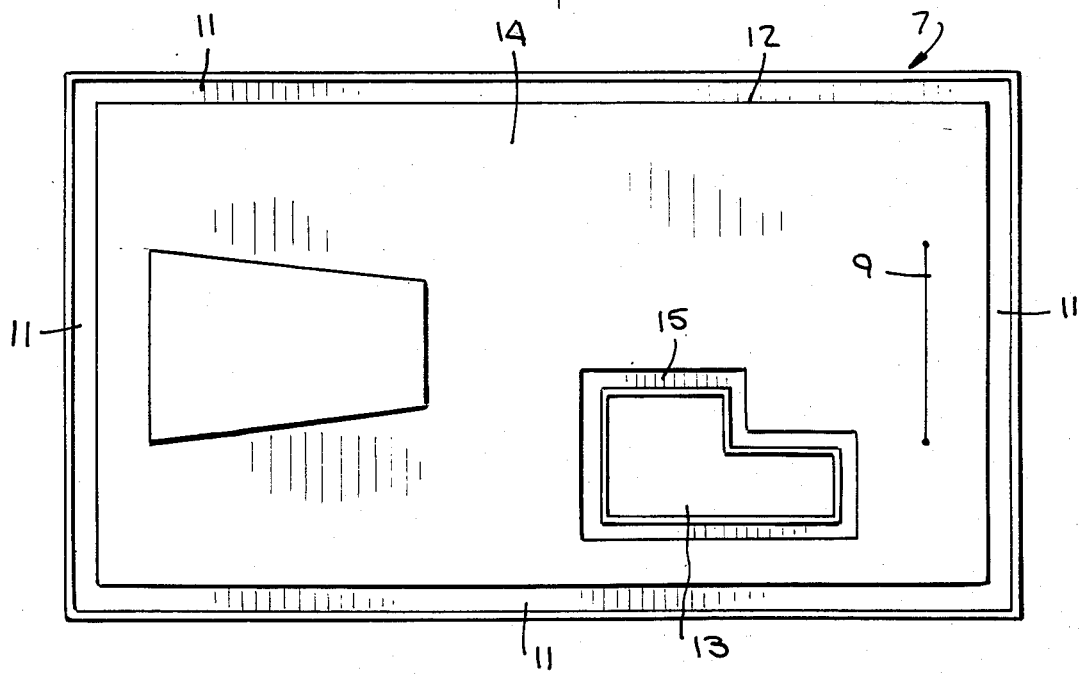

CONDENSATION SHIELD

This invention relates to postage meters and, more particularly, to a postage meter having a novel condensation shield for the main logic board.

BACKGROUND OF THE INVENTION

Generally, the main components of a postage meter comprise a top cover, a meter assembly and an electronic circuitry means usually in the form of a printed circuit board. Since these postage meters are subjected to transportation, use and storage in a multitude of environments, it is not uncommon for some condensation in the internal portion of the meter. For example, if the meter is carried from a cold environment to a warmer location, it is likely that water vapor will build up in the internal portions of the postage meter. This condensation or water vapor will in many instances come into contact with the power or circuit supply board and cause severe malfunctioning. In addition to this moisture problem, static electricity or charge is sometimes formed within the meter which also causes malfunctioning of the circuit board. Static electricity which builds up within the meter can result in a loss or distortion of data stored in the meter. This can result in improper operation of the meter including the possible improper accounting for postage which has been printed or which is available to be printed. A major problem in covers for electronic equipment relates to the fact that wiring must often be run to and from the electronic components through holes in protective coverings. These protective coverings are intended to protect the electronics where the device is subject to extremes in temperature and vibration.

There have been several attempts to eliminate or minimize this problem. One such procedure involves coating the circuit board with a conventional urethane spray. This however has not proven to be successful in totally eliminating the moisture problem. A more successful protective coating process involved Parylene vacuum coating the circuit board. This coating is able to penetrate beneath integrated circuits and other electronic elements to satisfactorily shield the sensitive board from moisture. These coatings are generally applied in about 1 mil thickness which seems to satisfy most moisture protection needs. This Parylene coating procedure for forming coating or protective shields for moisture sensitive electronics is described in an article in *Electronics Packaging and Production*, June 1984, pages 150-151. Unfortunately, this described procedure requires special preparation, specific application equipment and laboratory capabilities which take it out of the realm of typical manufacturing coatings and encapsulants. Items to be coated must first be cleaned and primed, followed by procedures which take into account a controlled thickness as well as conformal coverage. Its widespread use has been limited because of the complexity involved and the impractical nature of it. In addition, each time a different logic board is to be coated, new parameters must be determined, and the procedure must be radically adjusted.

Various protective shields have been used in the prior art especially those adapted for use with a circuit board. These protective devices are described in U.S. Pat. Nos. 3,845,253; 3,909,504; 4,308,953; 4,322,702; 4,386,388; 4,388,671; 4,394,707 and 4,399,487. In U.S. Pat. No. 3,845,253 an insulating block or shield is used but because of its non-conductive nature, it is of little use in dissipating static electricity. In U.S. Pat. No. 4,322,702 another protective shield or housing of insulating material is disclosed and as in U.S. Pat. No. 3,845,253 this type protector does not assist in disposing of unwanted accumulated static electricity. In U.S. Pat. No. 4,386,388 an aluminum sheet protector is disclosed but there is no provision therein for the venting of internally generated gases. In U.S. Pat. No. 4,394,707 the protection for the circuit package also involves the use of an electrically insulating cover for the electrical components. There is no provision for the venting of generated gases out of the package. U.S. Pat. No. 4,388,671 discloses a means to protect against electrostatic charges, however, no overall protection is provided for the electrical components. The shield described in U.S. Pat. No. 4,399,487 is an aluminum foil without provision for gas venting or moisture protection.

In U.S. Pat. No. 4,308,953 a protective device for electronics is disclosed which involves the use of a cardboard container which is conductive. The main purpose of this prior art container is to provide an electrically conductive means for grounding circuit boards and the like having static sensitivity planar objects. Devices such as postage meters easily pick up static charges in storage or transportation and unless dissipated, these charges will adversely affect the functioning of the meter. While the device disclosed in U.S. Pat. No. 4,308,953 effectively prevents the build up of static charges in a device containing electronic components, it is constructed of cardboard which provides little or no protection for the water vapor problem alluded to above. In U.S. Pat. No. 3,909,504 a moisture protective means is disclosed for electronic components. This prior art means involves the use of a polyethylene bag to surround the components. While appropriate moisture and temperature protection is afforded by these bags, heat is easily retained within the bag which could eventually degrade the circuitry and cause problems.

It is therefore clear that a protective cover for electronic circuit boards or the like should include moisture protection in addition to providing means to minimize the presence of unwanted electrical charges such as static electricity. The cover should be easily adapted to modern manufacturing methods, be versatile in use and provide for protection of the circuit board and, most important, venting of damaging heat generated during use. These needs are not totally provided for in known prior art devices discussed above.

SUMMARY OF THE INVENTION

It is therefore an object of this invention to provide a barrier or shield for electronic circuit boards devoid of the above-noted disadvantages.

It is another object of this invention to provide a main logic board shield adapted for use in a postage meter.

Another object of this invention is to provide a logic board shield that is relatively easy to manufacture and readily adapted for use in a variety of structures.

Still another object of this invention is to provide a protective shield for logic boards that protects the logic board from condensation while at the same time permitting generated heat to escape or dissipate.

Yet another object of this invention is to provide a shield for logic boards in postage meters having this circuitry in the bottom portions of the meters.

The foregoing objects and others are accomplished by this invention, generally speaking, by providing a contoured thermoformed barrier shield or cover for logic boards found in postage meters. This logic board and shield comprise the electrical circuitry means of this invention. This cover or shield permits the printed circuit boards to interface with the metering mechanism while allowing internally generated heat to channel to the outside. It also prevents condensation generated in the meter from depositing onto the board and causing malfunctioning. This damaging condensation can contain iron oxide from the steel frames or other components of the postage meter.

The shield can be constructed from any suitable conductive material that does not emit plasticizers, protects against moisture and assists in dissipating static electricity that may form internally. Preferred materials are conductive polypropylene, polyvinylchloride, polyethylene or mixtures thereof. These materials may be filled and coated. Filler materials are carbon, powdered iron or flaked aluminum foil laminate or vaporized aluminum or zinc.

The conductive shield is connected to ground to dissipate any static electricity or charge generated therein or thereon that may interfere with the normal operation of the circuit board. Static electricity can erase the memory in a microprocessor by the electromagnetic field it may create. The conductive shield of this invention when attached to ground will dissipate an electrical charge before it can be stored up to a harmful level.

The shield has a raised ceiling portion to accommodate multiple use in different postage meters with a variety of electronic circuit board configurations. This raised portion also permits a passageway or conduit for internally-generated heat to pass through the shield and out a vent positioned in the raised ceiling. In addition, a slit or minute opening is provided in this ceiling to allow electrical connection between the meter and circuit board.

The shield also provides protection for the circuit board against any other debris or contaminates that may deposit or fall upon the lower portion of the postage meter. The shield has channelling around its entire periphery to collect moisture or water and prevent any inadvertent seepage through to the circuit board. The channelling is in the lower side walls of the shield, thereby allowing water or moisture from the ceiling portion to seep into the channel where it will eventually evaporate. As noted above, a vent is positioned in the ceiling portion to permit the escape of heat from within the shield or circuit board. This vent also has a channelling around its peripheral portion to prevent moisture from flow entering therein. To insure against water contacting the circuit board in the exposed portion under the vent opening, sensitive electrical portions are purposely omitted from that part of the circuit board directly below the heat vent in the shield.

The postage meter of this invention therefore contains all of the conventional components of known postage meters such as described in U.S. Pat. Nos. 3,978,457 and 4,301,507. In addition to these components, the protective barrier herein described is provided between the circuit board and the postage metering mechanism located above it.

BRIEF DESCRIPTION OF DRAWING

FIG. 2 is a perspective view of the protective barrier or shield of this invention.

FIG. 3 is a top plan view of the protective barrier or shield of this invention.

DESCRIPTION OF THE DRAWING AND PREFERRED EMBODIMENTS

Figure 1:
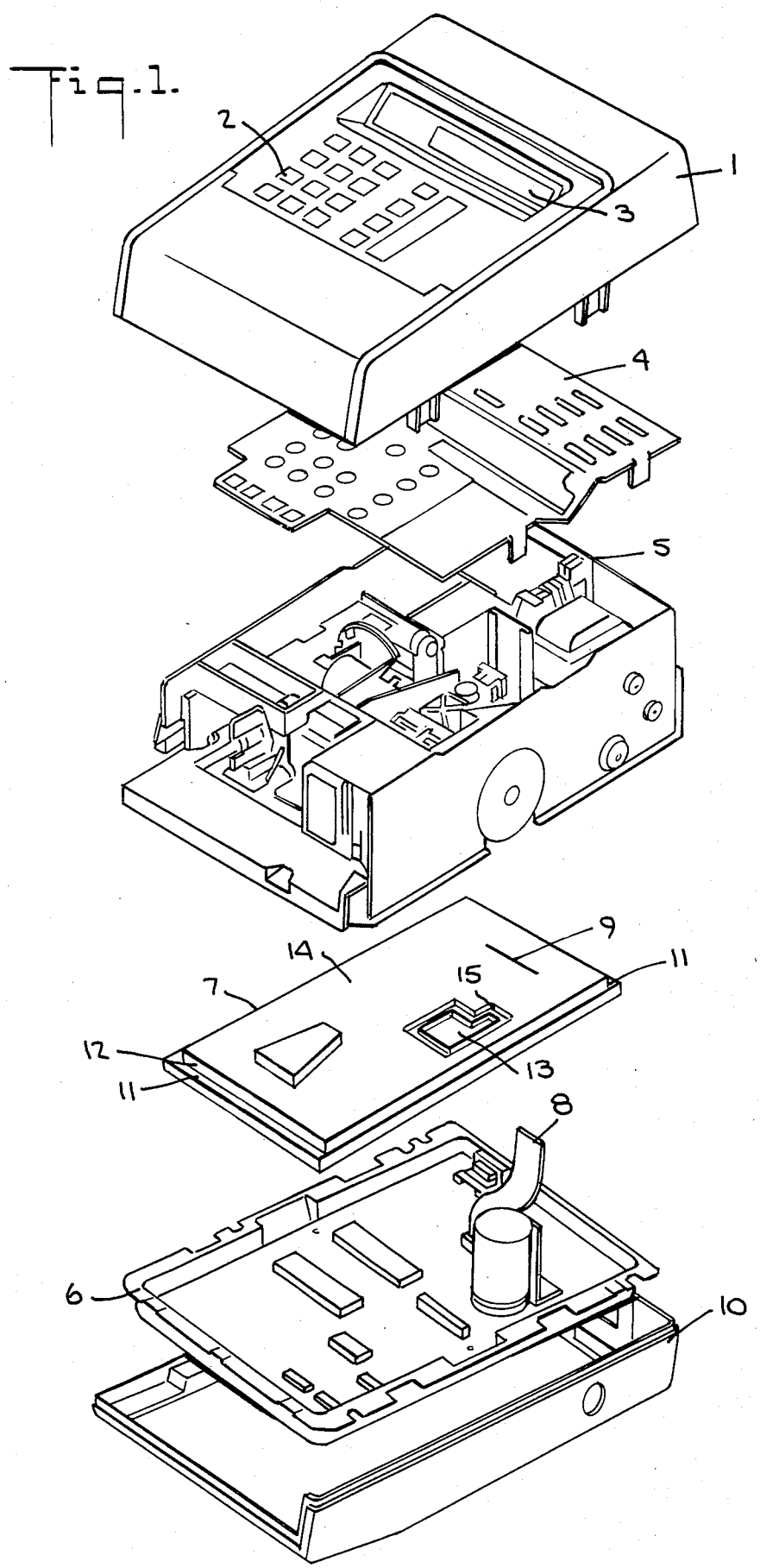
FIG. 1 is a fragmentary, partically exploded view of the postage meter constructed in accordance with the present invention.

In FIG. 1 the main components of a postage meter are illustrated in a detached arrangement. The top cover 1 usually contains the value selector or keyboard 2 for inputting the value to be printed out. Also located in the top cover is the value display window 3 which indicates the value input. All of the other elements of a value selector and keyboard in a conventional postage meter are present but because they are not necessary to understand the present invention they are not illustrated in detail here. The stiffener assembly 4 is located below the cover 1 and adapted to impart rigidity and strength to the postage meter structure. Below stiffener assembly 4 is the conventional metering mechanism 5 which is described in detail in U.S. Pat. No. 3,682,378. Between this metering mechanism 5 and base pan assembly 6 is positioned the conductive protective barrier shield 7 of this invention.

The circuit board which is located in base pan 6 make up the electrical circuitry means referred to in this disclosure. The circuit board is contained within base pan assembly 6 and is electrically connected to the metering mechanism 5 by electrical flex strip 8. Flex strip 8 fits through shield slit 9 and is electrically connected to metering mechanism 5. The bottom cover 10 completes the housing for the components and supports the logic board and base pan assembly 6. In FIG. 2 the barrier means or shield 7 is shown in perspective. Around the peripheral portion of shield 7 is a channel or trough 11 which is adapted to collect moisture or debris that is generated or is otherwise present within the postage meter. Without this channelling 11 moisture could seep through the peripheral edges of the shield 7 and damage the circuit board. The shield 7 has a raised side portion 12 to accommodate the collection and venting of heat and gasses that are generated by the circuit board. The heat and gasses are vented out through heat passage or vent 13 which is located in a corner portion of roof 14. Heat vent 13 can be positioned at any selected area above where substantially no sensitive elements of the circuit board are found. The heat vent 13 also has a channelling 15 around its peripheral edge to prevent seepage of moisture into the inner roof or other parts of the shield 7. The entire shield 7 is constructed from a substantially conductive plastic such as the preferred polypropylene, polyvinylchloride, polyethylene or mixtures thereof. Of course, any other suitable conductive plastic may be used if desired. A metal shield would not function in this invention because it would interfere with the proper functioning of logic board in assembly 6. This plastic conductive shield is grounded to dissipate any static charge or electricity which may be present. The circuit board 6 is connected to metering mechanism 5 through electrical connector of flex strip 8 which passes through slit 9 located in roof 14 of shield 7. This slit should be very tight to prevent debris or moisture from passing therethrough. In FIG. 3 a top plan view of shield 7 is illustrated. Opening 13 is large enough to provide proper venting of heat from below in the interior of shield 7. It is important that channels 15 be located around the edging of vent 13 to prevent water seepage or other contaminants from easily falling into the interior portion of the shield. Around the complete peripheral edge of shield 7 is also located channelling 11 which minimizes any seepage of water through the rim or edge of shield 7.

The preferred and optimumly preferred embodiments of the present invention have been described herein and shown in the accompanying drawing to illustrate the underlying principles of the invention, but it is to be understood that numerous modifications and ramifications may be made without departing from the spirit and scope of this invention.

What is claimed is:

1. A postage meter comprising a meter housing, a metering mechanism, a keyboard and an electrical circuitry means, said electrical circuitry means in electrical contact with said metering mechanism and positioned below said metering mechanism, said electrical circuitry means comprising a circuit board and a conductive barrier shield covering said circuit board, said shield adapted to prevent contaminants from depositing onto said circuit board, said shield having means for collecting and venting of heat that is generated by said circuit board, said shield comprising around its peripheral edge portion a trough or channel for collecting contaminants before they contact said circuit board.

2. The postage meter of claim 1 wherein said barrier shield is located between said circuit board and said metering mechanism.

3. The postage meter of claim 1 wherein said means for venting heat comprises an opening in said shield wherein a channel is provided along the entire periphery of said opening.

4. The postage meter of claim 1 wherein said conductive shield is connected to ground.

5. The postage meter of claim 1 wherein said shield has an opening therein to provide electrical contact means to fit therethrough and electrically connect said circuit board to said metering mechanism.

6. The postage meter of claim 1 wherein said shield is constructed from a conductive polymeric material.

7. The postage meter of claim 1 wherein said shield is constructed from a material selected from the group consisting of polypropylene, polyvinylchloride, polyethylene and mixtures thereof.

8. The postage meter of claim 1 wherein said shield has raised side portions and a top roof portion, said roof portion containing said means for venting heat.

9. A postage meter of claim 1 wherein said shield has raised side portions and a top roof portion, said roof portion containing an opening means for providing access for electrical connection between said metering mechanism and said circuit board.

10. A postage meter comprising a keyboard containing cover, a metering mechanism, an electronic circuitry means and a barrier shield means, said electronic circuitry means comprising a circuit board which is in electrical contact with said metering means, said circuit board positioned below said metering means and having therebetween said conductive barrier shield means, said shield having means for venting heat and gasses and being adapted to prevent contaminants from depositing onto said electronic circuitry means, and a vent opening adapted to permit the passage and venting of heat and gasses generated by said electronics circuitry means.

11. The postage meter of claim 10 wherein said means for venting heat comprises an opening in said shield wherein a channel is provided along the entire periphery of said opening.

12. The postage meter of claim 10 wherein said conductive shield is connected to ground.

13. The postage meter of claim 10 wherein said shield has an opening therein to provide electrical contact means to fit therethrough and electrically connect said circuit board to said metering mechanism.

14. The postage meter of claim 10 wherein said shield is constructed from a conductive polymeric material.

15. The postage meter of claim 10 wherein said shield is constructed from material selected from the group consisting of polypropylene, polyvinylchloride, polyethylene and mixtures thereof.

16. The postage meter of claim 10 wherein said shield has raised side portions and a top roof portion, said roof portion containing said means for venting heat.

17. The postage meter of claim 10 wherein said shield has raised side portions and top roof portion, said roof portion containing an opening means for providing access for electrical connection between said metering mechanism and said circuit board.

* * * * *